United States Patent [19]

Blumenfeld

[11] 4,030,116
[45] June 14, 1977

[54] HIGH ASPECT RATIO P-N JUNCTIONS BY THE THERMAL GRADIENT ZONE MELTING TECHNIQUE

[75] Inventor: Samuel M. Blumenfeld, Schenectady, N.Y.

[73] Assignee: General Electric Company, Schenectady, N.Y.

[22] Filed: May 16, 1975

[21] Appl. No.: 577,999

Related U.S. Application Data

[62] Division of Ser. No. 411,151, Oct. 30, 1973, Pat. No. 3,897,277.

[52] U.S. Cl. .................................. 357/32; 357/55; 357/60; 357/88; 357/89; 357/90
[51] Int. Cl.² .................. H01L 29/06; H01L 29/04
[58] Field of Search ................ 357/32, 55, 60, 89, 357/88, 90

[56] References Cited

UNITED STATES PATENTS 2,813,048  11/1957  Pfann ................................. 357/60

Primary Examiner—Edward J. Wojciechowicz
Attorney, Agent, or Firm—Donald M. Winegar; Joseph T. Cohen; Jerome C. Squillaro

[57] ABSTRACT

A thermal gradient zone melting technique is employed to migrate an array of metal buttons through a body of semiconductor material to form high aspect ratio P-N junctions therein. Semiconductor devices embodying such P-N junctions are suitable for employment in X-ray and infrared detection and imaging. Each button preferably has the configuration of an equilateral triangle and the array preferably has a hexagonal configuration.

10 Claims, 3 Drawing Figures

HIGH ASPECT RATIO P-N JUNCTIONS BY THE THERMAL GRADIENT ZONE MELTING TECHNIQUE

This is a division of application Ser. No. 411,151, filed Oct. 30, 1973, now U.S. Pat. No. 3,897,277.

BACKGROUND OF THE INVENTION

1. Field of the Invention

This invention relates to a method of making arrays of high aspect ratio P-N junctions by the temperature gradient zone melting technique.

2. Description of the Prior Art

W. G. Pfann in his U.S. Pat. No. 2,813,048 and other related articles and patents teaches a temperature gradient zone melting process for making semiconductor devices. In all of his teachings, Pfann initiates the thermal migration process by placing a solid sheet or a piece of wire on a surface and in prepared holes in a surface of a body of single crystal semiconductor material. These procedures are limitations which unfortunately make process engineers shun Pfann's teachings relative to embodying temperature gradient zone melting as a practical tool in modern semiconductor manufacturing lines. However, if temperature gradient zone melting could be adapted for making semiconductor devices, then the devices envisioned by Dominic A. Cusano in his copending patent application entitled "Modified Target Diode-Array Vidicons for X-Rays, Infrared and Visible Need" and filed the same day as this patent application and assigned to the same assignee can become a reality and become a pronounced advancement of the semiconductor art field.

An object of this invention is to provide a new and improved temperature gradient zone melting process technique which overcomes the deficiencies and limitations of the prior art.

Another object of this invention is to provide a new and improved temperature gradient zone melting process technique for making high aspect ratio P-N junctions in a body of semiconductor material.

Other objects of this invention will, in part, be obvious and will, in part, appear hereinafter.

BRIEF DESCRIPTION OF THE INVENTION

In accordance with the teachings of this invention, there is provided a process for making high aspect ratio P-N junctions in a body of semiconductor material. The process comprises the steps of depositing a layer of metal, by sputtering and the like, on selected surface areas of one of two major opposed surfaces of a body of single crystal semiconductor material to form an array of metal buttons thereon. A melt is then formed of the metal of each button and the semiconductor material immediately adjacent to the button and in contact therewith. A temperature gradient is established substantially perpendicular to the two opposed surfaces and substantially parallel to the vertical axis of the body. Each melt is migrated along the thermal gradient from the one opposed major surface to other opposed major surface to form a region of recrystallized semiconductor material of the body having solid solubility of the metal therein to impart a selective type conductivity and selective resistivity thereto. The buttons may be alloyed to the surface prior to migrating them through the body.

DESCRIPTION OF THE INVENTION

Figure 1:
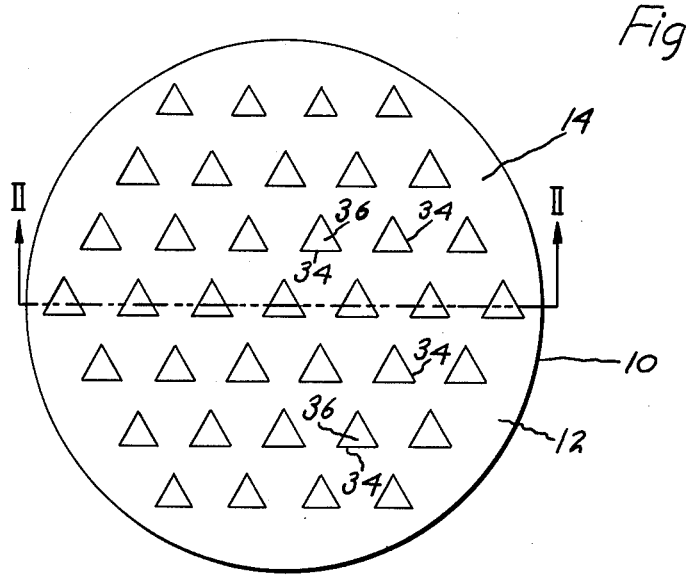
FIG. 1 is a top planar view of a body of semiconductor material being processed in accordance with the teachings of this invention.
Figure 2:
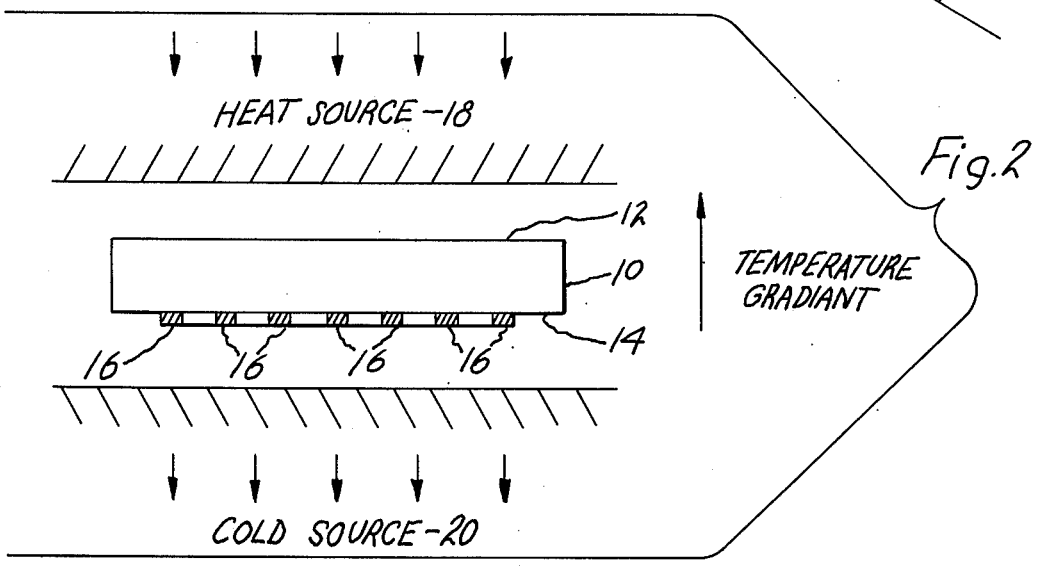
FIG. 2 is an elevation view, in cross-section, of the body of semiconductor material of FIG. 1, taken along the cutting plane II—II, being processed further in accordance with the teachings of this invention.

With reference to FIGS. 1 and 2, there is shown a body 10 of single crystal semiconductor material having top and bottom surfaces 12 and 14 comprising two major opposed surfaces thereof. The thickness of the body 10 varies in accordance with the requirements for which the body 10, when completely processed, will be employed. The material comprising the body 10 of semiconductor material may be silicon, germanium, silicon carbide, gallium arsenide, a compound of a Group II element and a Group VI element and a compound of a Group III element and a Group V element. The body 10 may be of any suitable type conductivity and be of a given resistivity necessary to make the desired finished device. By employing standard processing techniques followed by persons skilled in the art of semiconductor wafer processing techniques such, for example, as by lapping and polishing, the body 10 is prepared for metal vapor deposition techniques, such, for example, as chemical vapor deposition, sputtering and the like.

A plurality of metal buttons 16 are disposed on a selected area of the bottom surface 14 of the body 10. The metal buttons 16 are disposed thereon by any suitable means such, for example, as through various metal or silicon oxide masks which may be put in place by standard photolithographical techniques embodying the deposition of a photoresist and the patterning of the silicon oxide on metal materials through selective etching. Although the plurality of metal button 16 may be disposed in a random array, it is desired that an ordered array be employed for the fabrication of a semiconductor device to be employed as a radiant energy detection device for detection of X-ray, infrared and visible light and the like.

Although the metal buttons 16 may be of a round configuration arranged in columns and rows, it is desirable that the buttons have the configuration as shown in FIG. 1. In particular, each button 16 is an equilateral triangle 10 mil on each side. The buttons 16 are arranged in a hexagonal arrangement wherein the buttons are 20 mils from each other as measured from center to center. This preferred arrangement enables one to trap within and collect substantially all the carriers generated within the body 10 by exposure of the surface 12 to radiation by the judicious arrangement of the P-N junctions of mutually adjacent regions.

The material comprising the metal buttons is one which, when after having traversed the body 10 to the top surface 12 thereof by the practice of temperature gradient zone melting, forms a recrystallized region of semiconductor material having a second type conductivity. A P-N junction is thereby formed by the contiguous surfaces of the mutually adjacent semiconductor materials of opposite type conductivity. The material of the metal buttons 16 is therefore a metal or a metal alloy which contains a suitable dopant for the specific semiconductor material and which will produce the desired type conductivity and selective resistivity of the region or regions to be formed in the body 10. For example, the material of the metal buttons 16 may be one selected from the group consisting of aluminum, an alloy of aluminum and tin and an alloy of aluminum and lead when the body 10 is of N-type silicon or germanium semiconductor material.

It has been discovered that the metal arrays must be formed on the surface in this manner to maximize the surface contact area between the metal of the array and the semiconductor material so as to obtain the melt necessary to initiate thermomigration.

In order to explain the invention more particularly, the body 10 is said to be of silicon semiconductor material having N-type conductivity and the material comprising the metal buttons 16 is aluminum.

The processed body 10 is placed in a suitable apparatus (not shown) wherein temperature gradient zone melting is practiced. A carefully controlled one dimensional temperature gradient of approximately 50° to 200° C is maintained across the thickness of the body 10 for a preselected period of time. The temperature of the body 12 must be at least 600° C to have the aluminum alloy establish a molten zone within the body 10 but below 1400° C the melting point of the silicon. As shown in FIG. 2, the top surface 14 is placed close to a heat source 18 and the bottom surface 14 is placed close to a cold source 20. The unidirectional temperature gradient is established by heating the top surface and cooling the bottom surface.

Upon being heated to a temperature of above 600° C, the aluminum-silicon interface becomes molten and an aluminum enriched droplet is formed by each metal button 16. Migration of each aluminum enriched droplet from the bottom surface 14 to the top surface 12 occurs because of the unidirectional temperature gradient which is maintained. Each aluminum enriched droplet continually becmes molten as aluminum diffuses into the silicon interface forming an alloy which is molten in the temperature range encountered. At the rear interface of the aluminum enriched droplet, the temperature range is less than at the front interface and solidification occurs. Recrystallized silicon doped with aluminum, and thereby being of P-type conductivity, is grown as a continuing columnar structure between and terminating in the two major surfaces 12 and 14. The aluminum is present as a solid solubility metal in the recrystallized silicon of the body 10. The excess aluminum is removed from the surface 12 upon completion of the temperature gradient zone melting process and cooling the processed body 10 to room temperature. A portion of the completed radiation detection device 30 is shown in FIG. 3.

Figure 3:
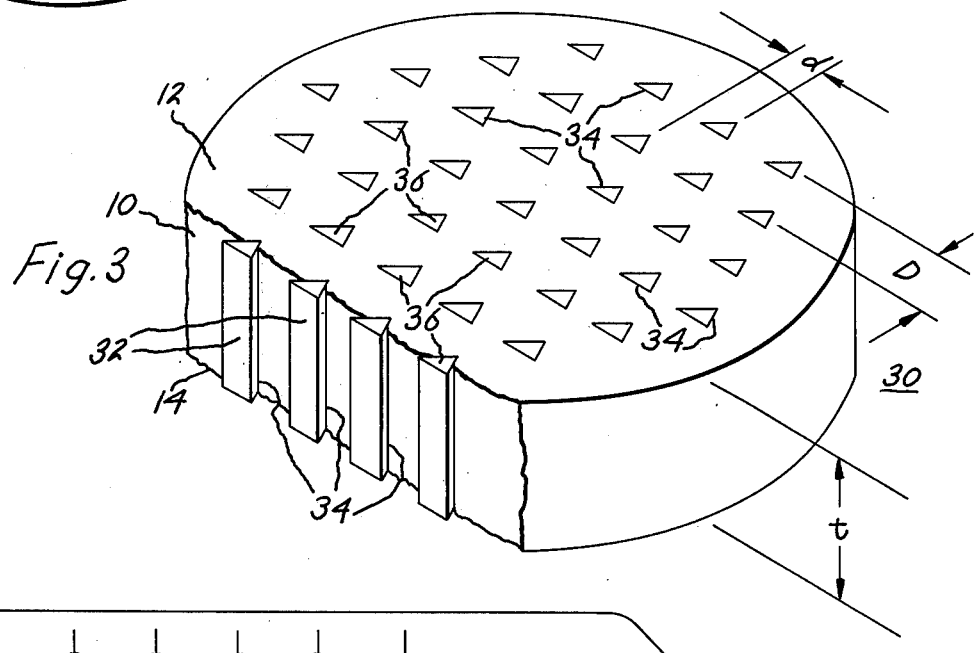
FIG. 3 is an isometric view, partly in cross-section, of a semiconductor device made in accordance with the teachings of this invention.

Referring now to FIG. 3, the radiation device 30 comprises processed body 10 of semiconductor material having P-type conductivity and top and bottom surfaces 12 and 14 respectively. A plurality of regions 32 of P-type conductivity formed by the thermal gradient zone melting process are disposed in the body 10. A P-N junction 34 is formed by the contiguous surfaces of each region 32 and that of the body 10. The end surface 36 of the region 32 forms an orderly array in both the top and the bottom surfaces 12 and 14, respectively. The columnar regions 32 are substantially parallel to each other and substantially perpendicular to the respective opposed major surfaces 12 and 14.

The regions 32 as formed in the body 10 each exhibit the presence of the P-N junctions 34. Each combination of a region 32 and the immediate adjacent portion of the body 10 comprises a semiconductor diode. The top surface 12 is exposed to radiant energy and the carriers generated within the body 12 are more efficiently collected by the P-N junction 34 than the carriers generated in prior art devices. The thickness, $t$, of the body and the distance, $d$, between centers of mutually adjacent regions 32 in adjacent rows and the distance D between center of mutually adjacent regions 32 in the same row are each determined for the particular radiant energy which the device is to detect.

Although my process as disclosed herein has proven to be successful in making deep diode arrays having high aspect ratio P-N junctions, a more successful process and suitable apparatus for producing the same devices is disclosed in the following co-pending patent applications of Thomas R. Anthony and Harvey E. Cline filed the same day as this patent application and assigned to the same assignee. Another successful method for initiating migration is to employ thermocompression bonding at a temperature of about 300° C to alloy 5 mil diameter aluminum wire leads to the surface in an order array. Excess lead material is removed and migrating of the alloyed leads is then initiated and practiced to completion to produce the device of FIG. 2.

Care must be exercised to keep the thermal gradient substantially perpendicular to the two major opposed surfaces 12 and 14 and substantially parallel to the vertical axis of the body 10. If not, the migration of the button melts, will wander within the body resulting in inefficient operation, or complete failure, of the devices.

It has been discovered that the quantity of the metal in each button is essential to the migration of the metal through the body. When the buttons are of the order of 1 mil in diameter but only 1 or 2 microns in thickness, the buttons only alloyed with the material, silicon, of the surface. No migration occurred through the body.

When the buttons are of the order of 20 microns in thickness, migration of the buttons through the body can be successfully initiated. However, another problem arises in that the buttons have a tendency to slide about the surface before enough of a melt occurs to initiate migration. Consequently, a disordered array rather than an ordered array results. This condition is alleviated in two ways. One way is to employ an initial heat treatment to alloy the buttons with the semiconductor material of the surface at a temperature of about 600° C for 15 minutes. Subsequently, migration of the alloyed buttons is initiated, the array still maintaining its desired configuration. The second way to alleviate the condition is, as previously described, by employing thermocompression bonding.

I claim as my invention:

1. A semiconductor device comprising
  a body of single crystal semiconductor material having opposed major surfaces, a first type conductivity, a vertical axis and a selected resistivity;
  an array of columnar regions disposed in the body substantially parallel to each other and the vertical axis of the body and substantially perpendicular to the two opposed major surfaces, each region extending between and terminating in the two major opposed surfaces and the material of the region consists of recrystallized semiconductor material of the body;

each region being formed in situ by the migration of a melt of a metal-rich semiconductor material through the body by thermal gradient zone melting at a predetermined elevated temperature along a thermal gradient substantially parallel with the vertical axis of the body and has a predetermined level of concentration of the metal of the melt therein as determined by the solid solubility limit of that metal in that semiconductor material at that predetermined elevated temperature of migration, the metal being distributed substantially uniformly throughout the entire region and comprising a dopant impurity material to impart a second and opposite conductivity thereto, and the metal is derived from a metal lead thermocompression bonded to the major surface from which migration is initiated;

a P-N junction formed by the contiguous surfaces of each region and the body, and each region has a substantially equilateral triangular cross-section.

2. The semiconductor device of claim 1 wherein the side of each region's cross-section is 10 mil, and including a hexagonal configuration for the array of regions wherein the regions are centered 20 mils from each other.

3. The semiconductor device of claim 1 wherein the metal is aluminum.

4. The semiconductor device of claim 3 wherein the material of the body is one selected from the group consisting of N-type silicon and N-type germanium.

5. The semiconductor device of claim 4 wherein the semiconductor material is N-type silicon.

6. The semiconductor device of claim 1 wherein the metal is an alloy which is one selected from the group consisting of aluminum and tin and aluminum and lead.

7. The semiconductor device of claim 2 wherein the material of the body is one selected from the group consisting of N-type silicon and N-type germanium.

8. The semiconductor device of claim 7 wherein the semiconductor material is N-type silicon.

9. The semiconductor device of claim 1 wherein the metal is an alloy of aluminum and tin, and the semiconductor material is N-type silicon.

10. The semiconductor device of claim 1 wherein the metal is an alloy of aluminum and lead.

* * * * *